(12) United States Patent
Karashima et al.

(10) Patent No.: US 7,640,659 B2
(45) Date of Patent: Jan. 5, 2010

(54) METHOD FOR FORMING CONDUCTIVE PATTERN AND WIRING BOARD

(75) Inventors: Seiji Karashima, Osaka (JP); Takashi Kitae, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 31 days.

(21) Appl. No.: 12/064,131

(22) PCT Filed: Aug. 11, 2005

(86) PCT No.: PCT/JP2006/315956

§ 371 (c)(1),
(2), (4) Date: Feb. 19, 2008

(87) PCT Pub. No.: WO2007/029452

PCT Pub. Date: Mar. 15, 2007

(65) Prior Publication Data

US 2009/0133901 A1  May 28, 2009

(30) Foreign Application Priority Data

Sep. 2, 2005  (JP) .............................. 2005-254773

(51) Int. Cl.
 *H05K 3/02*  (2006.01)
 *H05K 3/10*  (2006.01)
(52) U.S. Cl. ........................ 29/846; 156/556; 174/259
(58) Field of Classification Search ......... 174/259–261; 156/556; 29/846–853
See application file for complete search history.

(56) References Cited

U.S. PATENT DOCUMENTS 7,531,385 B1 * 5/2009 Karashima et al. .......... 438/119

(Continued)

FOREIGN PATENT DOCUMENTS

JP  2002-026070  1/2002

(Continued)

OTHER PUBLICATIONS

Rito et al. "Assembly Process by Electrically Conductive adhesive Using Low Melting Point Fillers", 9th Symposium on "Microjoining and Assembly Technology in electronics", Feb. 6-7, 2003 Yokohama, p. 115-120.

(Continued)

*Primary Examiner*—Jeremy C Norris
(74) *Attorney, Agent, or Firm*—McDermott Will & Emery LLP

(57) ABSTRACT

[Problem] To provide a conductive pattern formation method in which a fine pattern can be formed in a simple way at low cost.
[Means for Solving Problem] A flat plate having a convex pattern on its surface is provided so as to oppose a substrate, a fluid body including conductive particles and a gas bubble generating agent is supplied into a gap between the substrate and the flat plate, and thereafter, the fluid body is heated for generating gas bubbles from the gas bubble generating agent included in the fluid body. The fluid body is forced out of the gas bubbles as the gas bubbles generated from the gas bubble generating agent grow, so as to self-assemble between the convex pattern formed on the flat plate and the substrate owing to interfacial force, and an aggregate of the conductive particles included in the fluid body having self-assembled is made into a conductive pattern formed on the substrate.

18 Claims, 11 Drawing Sheets

U.S. PATENT DOCUMENTS

2005/0098775 A1    5/2005    Kondo
2009/0126876 A1*   5/2009    Karashima et al. .......... 156/556
2009/0229120 A1*   9/2009    Taniguchi et al. ............. 29/829

FOREIGN PATENT DOCUMENTS

| | | |
|---|---|---|
| JP | 2002-134878 | 5/2002 |
| JP | 2004-247572 | 9/2004 |
| JP | 2004-260131 | 9/2004 |
| JP | 2005-109435 | 4/2005 |

OTHER PUBLICATIONS

Yasuda et al. "Self-Organized Joining Assembly Process by Electrically Conductive Adhesive Using Low Melting Point Fillers", 10th Symposium on "Microjoinging and Assembly technology in Electronics" Feb. 5-6, 2004, Yokohama, pp. 183-188.

Yasuda et al. "Self-Organized Packing Using Polymer Containing Low-Melting-Point-Metal Filler-Process Simulation of Viscous Multi Phase Flow Fluid", 11th Symposium on "Microjoining and Assembly Technology in Electronics" Feb. 3-4, 2005 Yokohama, pp. 239-244.

Yamada et al., "Self-organized Packaging by polymer Containing Low Melting Point Metal—Experimental Verification of Process Rule Factors of Self-organization-", 11th Symposium on "Microjoining and Assembly Technology in Electronics" Feb. 3-4, 2005 Yokohama, pp. 245-250.

* cited by examiner

FIG. 9

| CONDUCTIVE PARTICLES | MELTING POINT (SOLIDUS) (°C) |
|---|---|
| Sn-58Bi | 139 |
| Sn-37Pb | 183 |
| Sn-9Zn | 199 |
| Sn-3.0Ag-0.5Cu | 217 |
| Sn-3.5Ag | 221 |
| Sn-0.7Cu | 228 |
| 12Sn-2.0Ag-10Sb-Pb | 240 |

FIG. 10

| GAS BUBBLE GENERATING AGENT | BOILING POINT (°C) | GAS BUBBLE GENERATING AGENT | BOILING POINT (°C) |
|---|---|---|---|
| hexane | 69 | dimethylamine hydrochloride | 171 |
| vinyl acetate | 72 | dimethyl sulfoxide (DMSO) | 189 |
| isopropyl alcohol | 83 | ethylene glycol | 198 |
| water | 100 | N-methyl-2-pyrolidone (NMP) | 204 |
| 1,4-dioxane | 101 | α-terpineol | 218 |
| butyl acetate | 126 | butyl Carbitol | 231 |
| propionic acid | 141 | butyl Carbitol acetate | 246 |

FIG. 11

| GAS BUBBLE GENERATING AGENT | DECOMPOSITION TEMPERATURE (°C) |
|---|---|
| boric acid | 70~ |
| ammonium metaborate | 120~ |
| sodium bicarbonate | 120-150 |
| 4,4'-oxybix(benzene sulfonylhydrazide) (OBSH) | 155-165 |
| azodicarbonamide (ADCA) | 197-210 |
| barium metaborate | 200~ |
| N,N'-dinitrosopentamethylenetetramine (DPT) | 200-250 |
| aluminum hydroxide | 230 |
| calcium aluminate | 230 |
| dawsonite | 230 |

METHOD FOR FORMING CONDUCTIVE PATTERN AND WIRING BOARD

RELATED APPLICATIONS

This application is the U.S. National Phase under 35 U.S.C. § 371 of International Application No. PCT/JP2006/315956, filed on Aug. 11, 2006, which in turn claims the benefit of Japanese Application No. 2005-254773, filed on Sep. 2, 2005 the disclosures of which Applications are incorporated by reference herein.

TECHNICAL FIELD

The present invention relates to a method for forming a conductive pattern on a substrate, and more particularly, it relates to a method for forming a conductive pattern in which a fine pattern can be obtained in a simple way.

BACKGROUND ART

In the case where a conductive pattern (a wiring pattern) is formed on a substrate such as a printed board, photolithography and etching are performed in general, and since these processes include a large number of complicated procedures, time and labor are necessary for forming a conductive pattern in general.

As a technique to form a fine conductive pattern without performing such processes, a method in which a conductive pattern is drawn on a substrate by using a conductive paste including metal nano-particles and the thus obtained conductive paste layer is heated for forming a desired conductive pattern is known (for example, Patent Documents 1, 2 and the like).

As a general method for drawing a conductive pattern, a screen mask provided with an opening is used as a template for applying a conductive paste in a desired thickness by a screen printing method (for example, Patent Document 1 and the like). Apart from this, a method in which a conductive paste is directly sprayed by an inkjet method for drawing a desired conductive pattern has been developed (for example, Patent Document 2 and the like).

Patent Document 1: Japanese Laid-Open Patent Publication No. 2004-247572

Patent Document 2: Japanese Laid-Open Patent Publication No. 2002-134878

DISCLOSURE OF THE INVENTION

Problems to be Solved by the Invention

The method for forming a conductive pattern described in each of Patent Documents 1 and 2 is simpler than the conventional complicated processes including the photolithography and the etching, and hence, a conductive pattern can be formed at a comparatively low cost.

However, it is difficult to form a fine pattern by the screen printing method, and there remain problems to be solved such as adhesion between a conductive paste and a substrate in the inkjet method. Thus, any of these methods has not become a principal technique to be replaced with the conventional conductive pattern formation method including the photolithography and the etching.

The present invention was devised in consideration of these circumstances, and an object of the invention is providing a conductive pattern formation method in which a fine pattern can be formed in a simple way at a low cost.

Means for Solving Problems

The conductive pattern formation method of this invention is a method for forming a conductive pattern on a substrate and includes a first step of providing a flat plate having a convex pattern on a surface thereof in facing relation to the substrate; a second step of supplying a fluid body containing conductive particles and a gas bubble generating agent into a gap between the substrate and the flat plate; and a third step of generating gas bubbles from the gas bubble generating agent contained in the fluid body by heating the fluid body, and in the third step, the fluid body is forced out of the gas bubbles generated from the gas bubble generating agent as the gas bubbles grow and self-assembles between the convex pattern formed on the flat plate and the substrate owing to interfacial force, and the conductive pattern formed on the substrate is made of an aggregate of the conductive particles contained in the fluid body having self-assembled.

In a preferred aspect, the fluid body is made of a resin, and the third step includes a sub-step of curing the resin after allowing the resin to self-assemble between the convex pattern and the substrate.

In a preferred aspect, the resin is a light setting resin and the resin having self-assembled between the convex pattern and the substrate is cured with light by selectively irradiating the resin with light in the third step.

In a preferred aspect, the flat plate is a transparent substrate, and a light masking film is preferably formed in a surface area of the flat plate other than the convex pattern.

In a preferred aspect, the conductive pattern is made of the aggregate of the conductive particles in which the conductive particles are in contact with one another.

In a preferred aspect, the third step includes a sub-step of heating the fluid body at a temperature at which the conductive particles are melted after allowing the fluid body to self-assemble between the convex pattern and the substrate, and the conductive particles are bonded to one another through metallic bond in the sub-step of heating.

A melting point of the conductive particles is preferably higher than a boiling point of the gas bubble generating agent.

In a preferred aspect, the third step includes a sub-step of pressing the flat plate against the substrate after allowing the fluid body to self-assemble between the convex pattern and the substrate, and the conductive particles are contact bonded to one another in the sub-step of pressing.

In a preferred aspect, the gas bubble generating agent is made of a material that boils when the fluid body is heated or a material that produces a gas through thermal decomposition.

The gas bubble generating agent is preferably made of two or more kinds of materials having different boiling points.

In a preferred aspect, the third step is performed while varying the gap between the substrate and the flat plate.

In a preferred aspect, at least a surface of the convex pattern is made of a metal.

In a preferred aspect, the third step includes a sub-step of filling a sealant in the gap between the substrate and the flat plate after allowing the fluid body to self-assemble between the convex pattern and the substrate and curing the sealant after filling.

In a preferred aspect, the convex pattern is formed as a convex pattern having at least two kinds of portions with different heights.

A portion with a smaller width is preferably higher than a portion with a larger width in the convex pattern.

In a preferred aspect, the substrate is a wiring board, and the conductive pattern corresponds to at least a part of a wiring pattern formed on the wiring board.

In a preferred aspect, the method further includes a step of removing the flat plate after the third step.

The conductive pattern preferably has a cross-section in a shape of an hourglass.

The wiring board of this invention is a wiring board on which a wiring pattern is formed, and the wiring pattern is formed by providing a flat plate having a convex pattern on a surface thereof in facing relation to the wiring board, supplying a fluid body including conductive particles and a gas bubble generating agent into a gap between the wiring board and the flat plate, and heating the fluid body for allowing the fluid body to self-assemble between the convex pattern formed on the flat plate and the wiring board, whereby forming the wiring pattern made of an aggregate of the conductive particles included in the fluid body having self-assembled.

In a preferred aspect, in the wiring pattern made of the aggregate of the conductive particles, the conductive particles are bonded to one another through metallic bond by heating the fluid body having self-assembled between the convex pattern and the wiring board.

EFFECT OF THE INVENTION

In the conductive pattern formation method of this invention, gas bubbles are generated from a gas bubble generating agent included in a fluid body by heating the fluid body supplied into a gap between a substrate and a flat plate, and the fluid body is forced out of the gas bubbles by the growing gas bubbles, so that the fluid body can be allowed to self-assemble between a convex pattern formed on the flat plate and the substrate owing to the interfacial force. As a result, an aggregate of the conductive particles included in the fluid body having self-assembled forms a conductive pattern, and thus, the conductive pattern can be easily formed in a simple way of heating.

Furthermore, since the conductive pattern is formed in a self-assembly manner in accordance with the convex pattern, the conductive pattern can be formed in a fine shape.

In addition, when a curable material such as a resin is used as the fluid body, the conductive pattern made of the aggregate of the conductive particles can attain a structure stable in the strength by curing the fluid body of the resin or the like after forming the conductive pattern through the self-assembly.

BRIEF DESCRIPTION OF DRAWINGS

FIG. 9 is a diagram for showing materials of conductive particles of this invention.

FIG. 10 is a diagram for showing materials of a gas bubble generating agent of this invention.

FIG. 11 is a diagram for showing materials of a gas bubble generating agent powder of this invention.

Figure 1A:
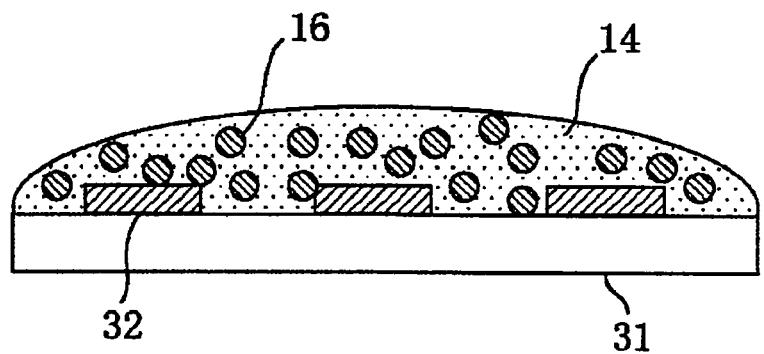
FIGS. 1A through 1D are cross-sectional views for showing basic procedures in a bump formation method utilizing self-assembly of a resin.

| Description of Reference Numerals | |
|---|---|
| 11,31 | substrate |
| 12,40 | flat plate |
| 13 | convex pattern |
| 14 | fluid body |
| 16 | conductive particles (solder powder) |
| 18 | conductive pattern |
| 19 | bump |
| 20,30 | gas bubble |
| 21 | sealant |
| 22 | light |
| 32 | electrode |

BEST MODE FOR CARRYING OUT THE INVENTION

The present inventor has made various examinations on a method for forming a bump through self-assembly of conductive particles (such as a solder powder) on an electrode of a wiring board or a semiconductor chip, or on a flip-chip mounting method by forming a connecting body between electrodes of a wiring body and a semiconductor chip through self-assembly of conductive particles between the electrodes, and has proposed a novel bump formation method and a novel flip-chip mounting method (Japanese Patent Application No. 2005-094232).

FIGS. 1A through 1D and 2A through 2D are diagrams for showing basic procedures in the bump formation method disclosed by the present inventor in the aforementioned patent application. The bump formation method alone will be herein described because the basic procedures are common to the flip-chip mounting method.

Figure 1B:
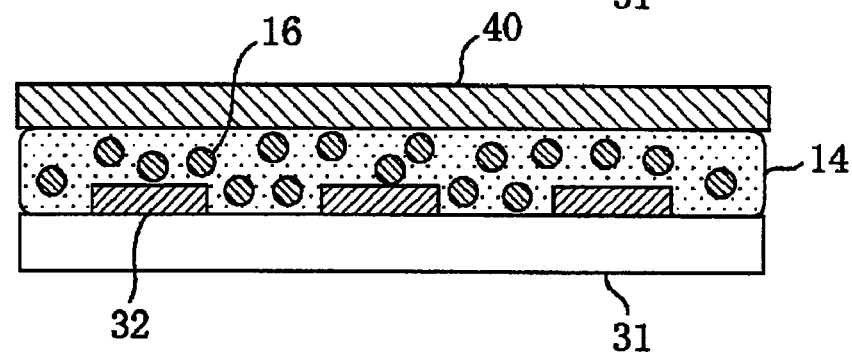

First, as shown in FIG. 1A, a fluid body (resin) 14 including conductive particles (solder powder) 16 and a gas bubble generating agent (not shown) is supplied onto a substrate 31 having a plurality of electrodes 32 thereon. Next, as shown in FIG. 1B, a flat plate 40 is provided on the surface of the fluid body (resin) 14.

Figure 1C:
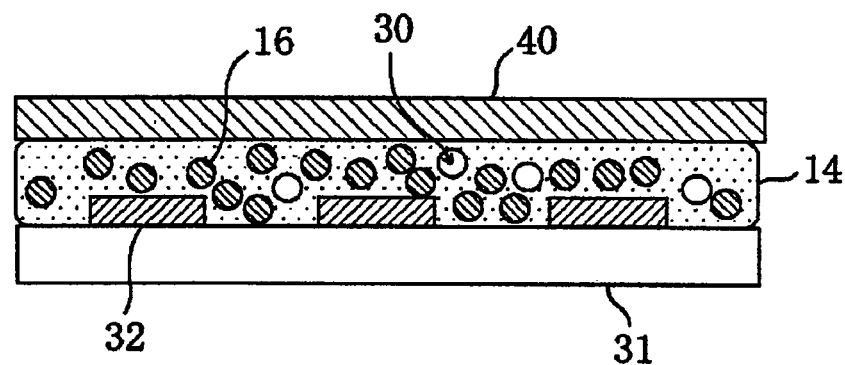
Figure 1D:
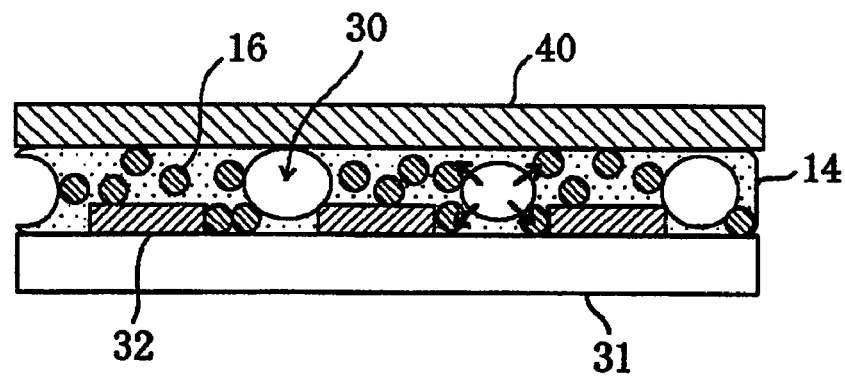

When the fluid body (resin) 14 is heated under this condition, gas bubbles 30 are generated from the gas bubble generating agent included in the fluid body (resin) 14 as shown in FIG. 1C. Then, the fluid body (resin) 14 are forced out of the gas bubbles 30 as the gas bubbles 30 thus generated grow as shown in FIG. 1D.

Figure 2A:
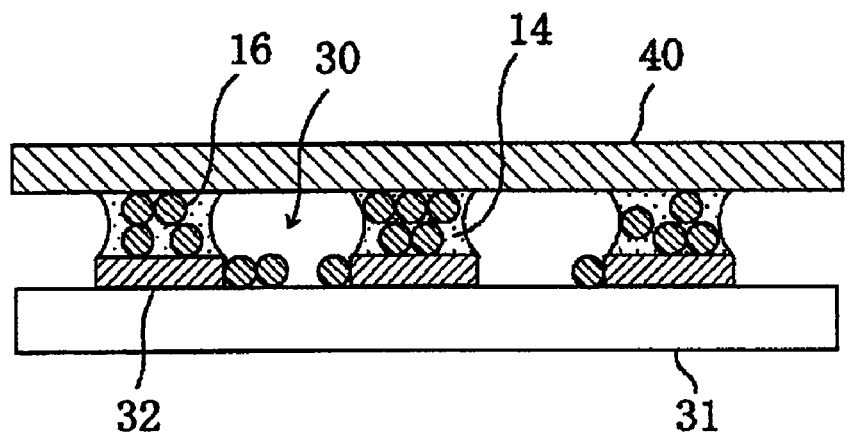
FIGS. 2A through 2D are cross-sectional views for showing other basic procedures in the bump formation method utilizing the self-assembly of a resin.
Figure 2B:
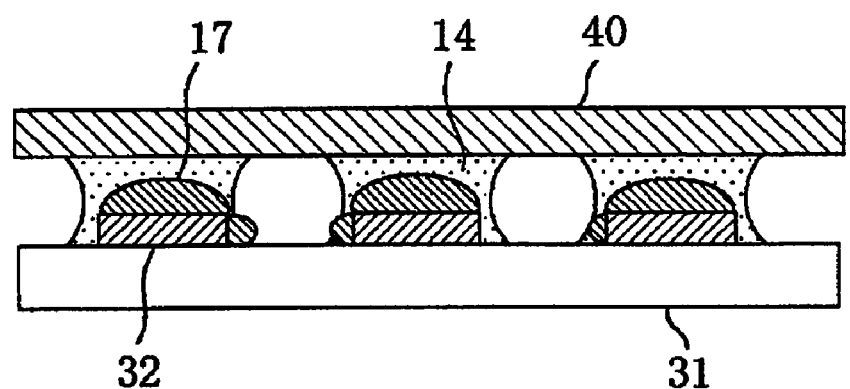

The fluid body (resin) 14 thus forced out self-assembles in the shape of a column on an interface with the electrode 32 of the substrate 31 and on an interface with the flat plate 40 as shown in FIG. 2A. Next, when the fluid body (resin) 14 is further heated, the conductive particles (solder powder) 16 included in the fluid body (resin) 14 are melted, and hence, the conductive particles (solder powder) 16 included in the fluid body (resin) 14 having self-assembled on the electrode 32 are bonded to one another through melting.

Figure 2C:
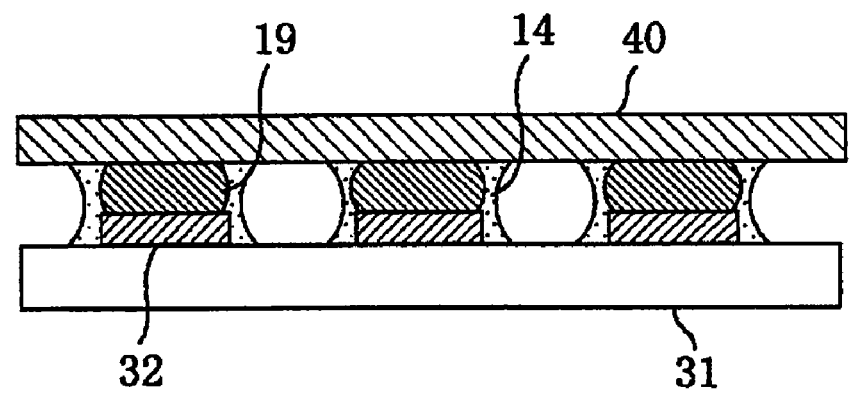
Figure 2D:
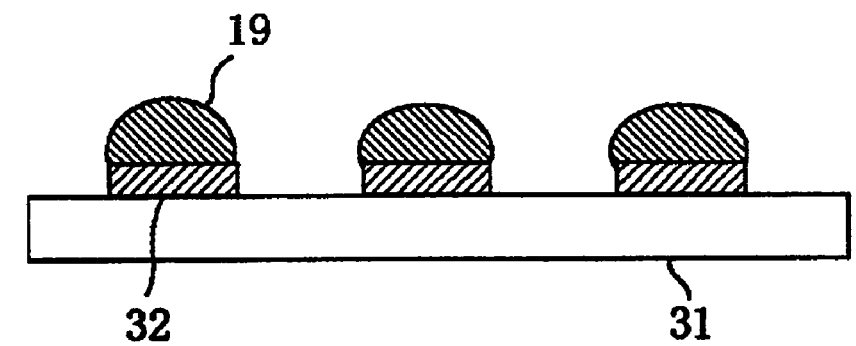

Since the electrode 32 has high wettability against the conductive particles (solder powder) 16 bonded to one another through melting, a bump 19 made of the melted solder powder is formed on the electrode 32 as shown in FIG. 2C. Ultimately, when the fluid body (resin) 14 and the flat plate 40 are removed, the substrate 31 having the bump 19 formed on the electrode 32 can be obtained as shown in FIG. 2D.

As a characteristic of this method, the fluid body (resin) 14 supplied between the substrate 31 and the flat plate 40 is heated so as to generate the gas bubbles 30, the fluid body (resin) 14 is forced out of the gas bubbles 30 as the gas bubbles 30 grow, and thus the fluid body (resin) 14 is allowed to self-assemble between the electrode 32 of the substrate 31 and the flat plate 40.

It is noted that the procedure for melting the solder powder by heating the fluid body (resin) 14 again after allowing the fluid body (resin) 14 to self-assemble on the electrode 32 is performed in order to ultimately form the bump 19 on the electrode 32.

Figure 3A:
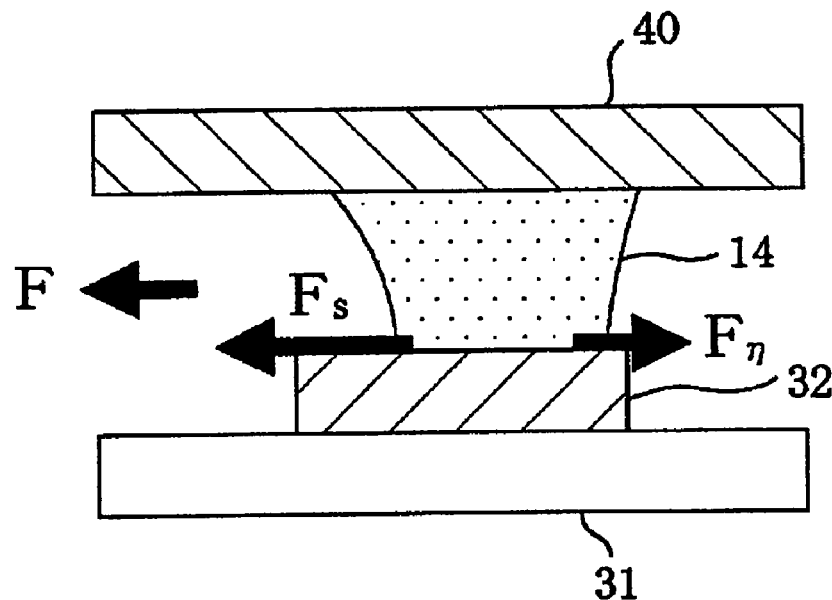
FIGS. 3A and 3B are diagrams for explaining the mechanism of the self-assembly of a resin.
Figure 3B:
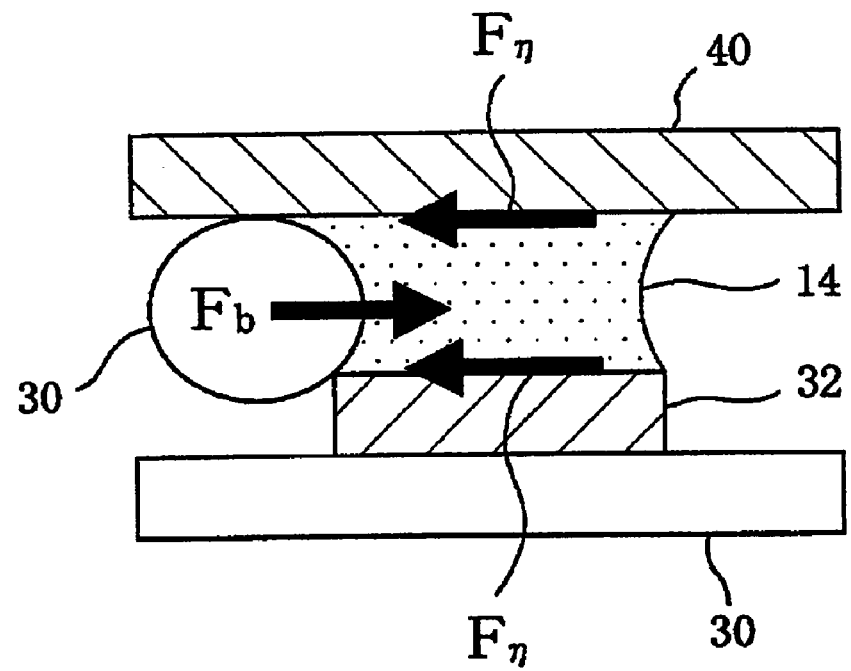

The phenomenon that the fluid body (resin) 14 self-assembles on the electrode 32 seems to be caused through a mechanism shown in FIGS. 3A and 3B.

FIG. 3A is a diagram for showing the state where the fluid body (resin) 14 is forced out onto the electrode 32 of the substrate 31 by a growing gas bubble (not shown). The fluid body (resin) 14 thus brought into contact with the electrode 32 is applied with stress $F_s(\propto \gamma)$ by the interfacial force $\gamma$ caused on the interface (the force derived from what is called wet spread of the resin) and is spread over the electrode 32 by the capillarity, and ultimately, the column-shaped fluid body (resin) having the boundary at the end of the electrode 32 is formed between the electrode 32 and the flat plate 40.

Although the column-shaped fluid body (resin) 14 formed on the electrode 32 through the self-assembly (hereinafter referred to as the "resin column") is applied with stress $F_b$ derived from the growth (or the movement) of the gas bubble 30 as shown in FIG. 3B, it can keep its shape owing to the function of stress $F_\eta(\propto \eta)$ derived from the viscosity $\eta$ of the fluid body (resin) 14.

At this point, whether the fluid body (resin) 14 having self-assembled can keep a given shape depends upon not only the interfacial force $\gamma$ but also an area S of the electrode 32, a length L of the gap between the electrode 32 and the flat plate 40 and the viscosity $\eta$ of the fluid body (resin) 14.

When the resin column is kept in a substantially cylindrical shape, the Laplace pressure $\Delta p$ is represented as follows with the radius of the cylindrical shape of the fluid body (resin) indicated by R and the wetting angle of the resin indicated by $\theta$:

$$\Delta p = \gamma \left( \frac{1}{R} - \frac{\cos\theta}{L/2} \right) \quad \text{[Formula 1]}$$

On the basis of this formula, it is understood that the resin column is in the shape of an hourglass and functions as attractive force when $\theta < 2/L$. Also, the stress Fs is represented as follows:

$$F_S = \pi R^2 \Delta p + 2\pi R \gamma \cos\theta \quad \text{[Formula 2]}$$

For example, Fs=−13 [μN] when γ=40 [mN/m], R=50 [μm], L=20 [μm] and θ=0[°]. Alternatively, Fs=−25 [μN] when γ=80 [mN/m], R=50 [μm], L=20 [μm] and θ=0[°]. Thus, the stability of the resin column can be increased by increasing the interfacial force γ.

Furthermore, a resin is controlled in accordance with the following Reynolds equation:

$$\frac{\partial}{\partial x}\left( h^3 \frac{\partial p}{\partial x} \right) = 12\eta \frac{\partial h}{\partial t} \quad \text{[Formula 3]}$$

Therefore, the stability of the resin column can be increased also by increasing the viscosity $\eta$.

As described above, the fluid body (resin) 14 is formed on the electrode 32 in a self-aligned manner by utilizing the self-assembly of the fluid body (resin) 14 caused by the interfacial force in this method. It can be said that the self-assembly caused by the interfacial force utilizes a phenomenon occurring merely on the electrode 32 on which the gap between the substrate 31 and the flat plate 40 is smaller because the electrode 32 formed on the substrate 31 is in a convex shape.

In the bump formation method, since the electrode is originally formed on the substrate in a convex shape, the fluid body (resin) naturally self-assembles on the electrode. The present inventor has noticed that if an arbitrary convex pattern is previously formed on a flat plate, a fluid body (resin) can be formed in a self-assembly manner in accordance with the convex pattern.

Specifically, when a convex pattern is formed on a flat plate in the same pattern as a desired conductive pattern, the desired conductive pattern can be formed on a substrate by utilizing the self-assembly of a fluid body (resin) caused by the interfacial force.

Now, preferred embodiments of the invention will be described with reference to the accompanying drawings. In the drawings mentioned below, the same reference numerals are used to refer to elements having substantially the same functions for simplifying the description. It is noted that the present invention is not limited to the embodiments described below.

FIGS. 4A through 4E are diagrams for showing basic procedures in a conductive pattern formation method according to an embodiment of the invention.

Figure 4A:
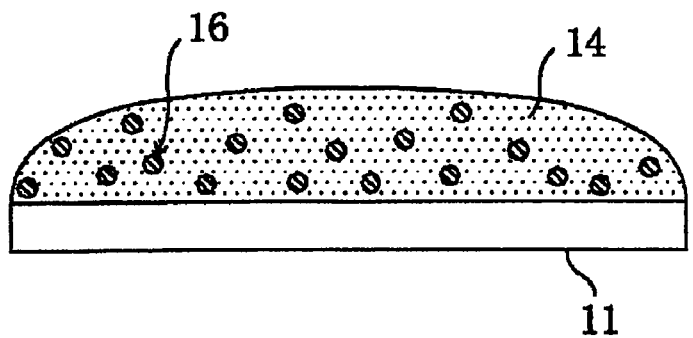
FIGS. 4A through 4E are cross-sectional views for showing basic procedures in a conductive pattern formation method of this invention.
Figure 4B:
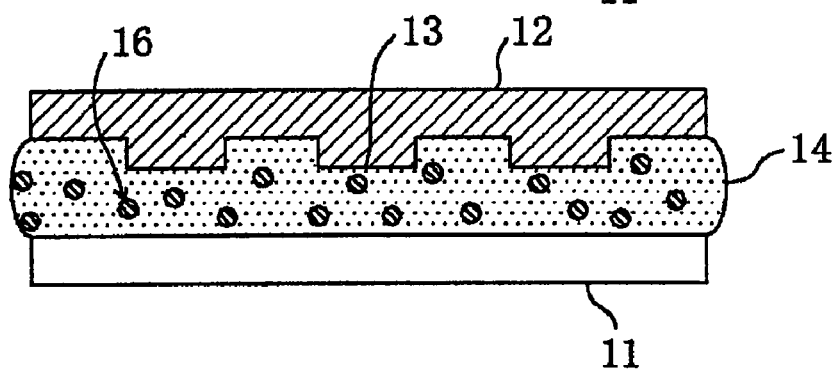

First, as shown in FIG. 4A, a fluid body 14 including conductive particles 16 and a gas bubble generating agent (not shown) is supplied onto a substrate 11. Next, as shown in FIG. 4B, a flat plate 12 having a plurality of convex patterns 13 is provided on the surface of the fluid body 14 so as to oppose the substrate 11.

At this point, the convex patterns 13 are formed on the flat plate 12 in the same layout as a conductive pattern to be formed on the substrate 11. Also, in the case where the substrate 11 is, for example, a wiring board on which electronic components and the like are built, the flat plate 12 is provided above the substrate 11 with necessary alignment.

It is noted that these procedures may be performed by previously providing the substrate 11 and the flat plate 12 so as to oppose each other with a given gap and then supplying the fluid body 14 including the conductive particles 16 and the gas bubble generating agent into the gap therebetween.

Figure 4C:
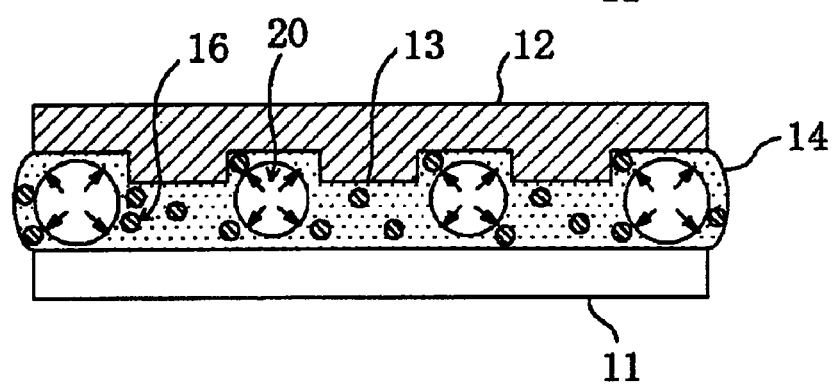

When the fluid body 14 is heated under this condition, gas bubbles 20 are generated from the gas bubble generating agent included in the fluid body 14 as shown in FIG. 4C. At this point, the fluid body 14 is forced out of the gas bubbles 20 as the gas bubbles 20 grow.

Figure 4D:
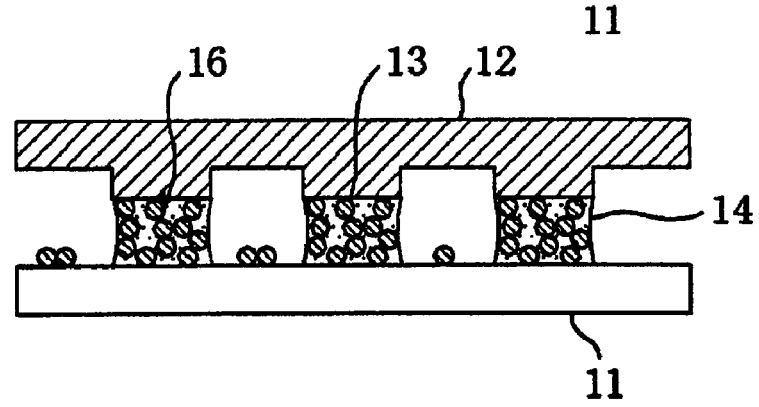
Figure 4E:
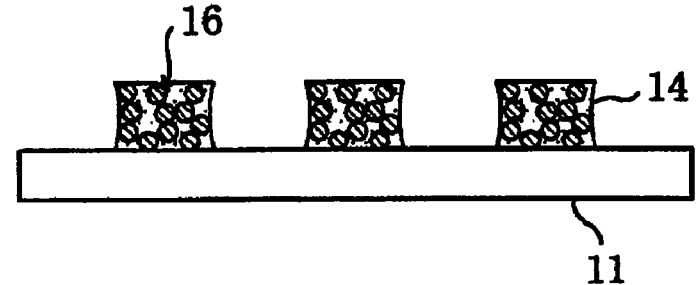

The fluid body 14 thus forced out self-assembles between the convex patterns 13 formed on the flat plate 12 and the substrate 11 owing to the interfacial force as shown in FIG. 4D. When the flat plate 12 is removed, patterns of the fluid body 14 obtained through the self-assembly is formed on the substrate 11.

At this point, an aggregate of the conductive particles 16 included in the fluid body 14 having self-assembled forms the conductive patterns with the conductive particles 16 in contact with one another.

Figure 5:
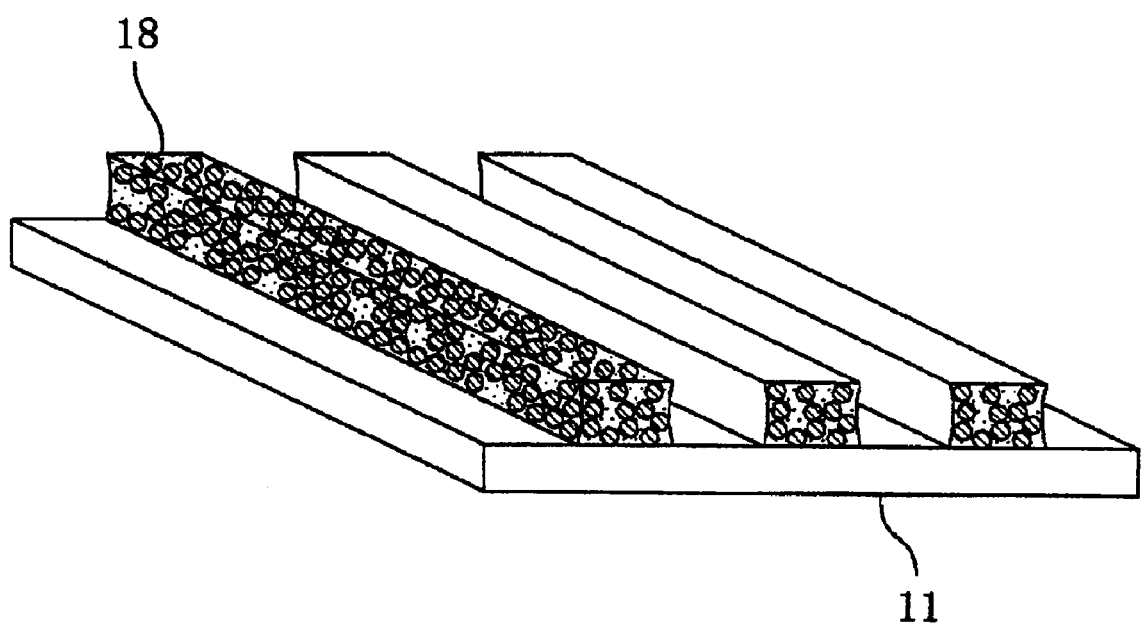
FIG. 5 is a perspective view for showing the structure of a conductive pattern formed on a substrate in the invention.

FIG. 5 is a perspective view of the conductive patterns 18 formed on the substrate 11 through the procedures shown in FIGS. 4A through 4E. Although the conductive patterns 18 are in a linear shape with a constant width in FIG. 5, the width may be varied in the middle. Alternatively, not only a linear pattern but also a bent pattern or a crossing pattern can be formed. In this case, in order to easily keep the shape of the fluid body 14 having self-assembled, each corner of the conductive patterns may be designed to have inclination of 45 degrees or a curvature.

In the case where the substrate 11 is a wiring board, the conductive patterns 18 correspond to wiring patterns.

According to this invention, gas bubbles are generated from the gas bubble generating agent included in the fluid body 14 by heating the fluid body 14 supplied into the gap between the substrate 11 and the flat plate 12, and the fluid body 14 is forced out of the gas bubbles by the growing gas bubbles, so that the fluid body 14 can be allowed to self-assemble between the convex patterns 13 formed on the flat plate 12 and the substrate 11 owing to the interfacial force. As a result, the aggregate of the conductive particles 16 included in the fluid body 14 having self-assembled forms the conductive patterns 18, and thus, the conductive patterns 18 can be easily formed in a simple way of heating.

Furthermore, since the conductive patterns 18 are formed in accordance with the convex patterns 13 in a self-assembly manner, the conductive patterns 18 can be formed in fine shapes.

Moreover, since each conductive pattern formed in this invention has a cross-section typically in the shape of an hourglass (having a neck in the middle), the adhesiveness to the substrate can be improved as compared with a wiring pattern (typically having a rectangular or trapezoidal cross-section) formed by the conventional method including the etching and the like. Also, since its face opposite to the face on the side of the substrate is formed in substantially the same size as the face on the side of the substrate, also when the conductive pattern is to be connected to, for example, a gold bump formed on a semiconductor chip, the connection area can be large, so as to realize highly reliable semiconductor mounting.

It is noted that the sizes of the respective elements and the relative positional relationship among them (for example, the size of the conductive particles 16 and the length of the gap between the substrate 11 and the flat plate 12) shown in FIGS. 4A through 4E and 5 are given merely for the sake of convenience and do not correspond to the actual sizes and the like.

Next, a conductive pattern formation method in using a light setting resin as the fluid body 14 will be described with reference to FIGS. 6A through 6E.

Figure 6A:
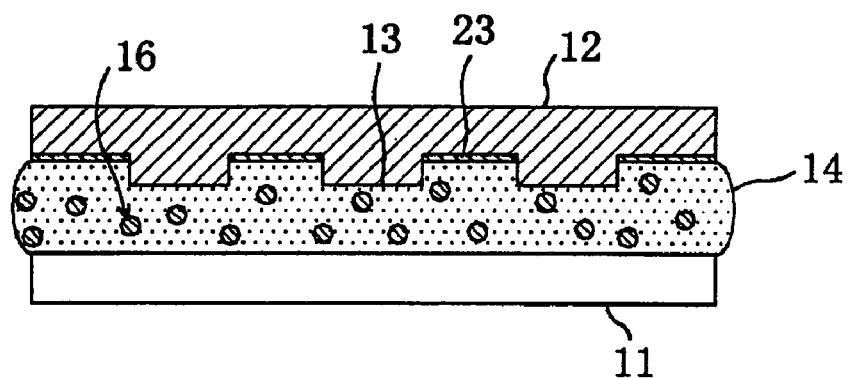
FIGS. 6A through 6E are cross-sectional views for showing procedures in a conductive pattern formation method according to another embodiment of the invention.

As shown in FIG. 6A, a flat plate 12 having convex patterns 13 thereon is provided so as to oppose a substrate 11, and a fluid body (light setting resin) 14 including conductive particles 16 and a gas bubble generating agent (not shown) is supplied into a gap between the substrate 11 and the flat plate 12.

Figure 6B:
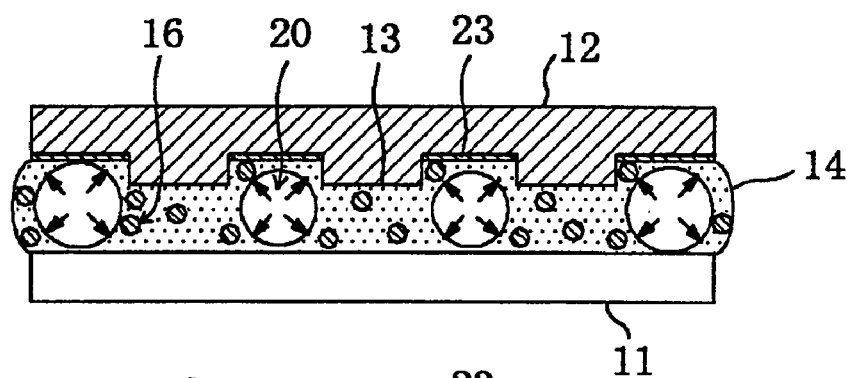

When the fluid body (light setting resin) 14 is heated under this condition, gas bubbles 20 are generated from the gas bubble generating agent included in the fluid body (resin) 14 as shown in FIG. 6B. At this point, the fluid body (resin) 14 is forced out of the gas bubbles 20 as the generated gas bubbles 20 grow.

Figure 6C:
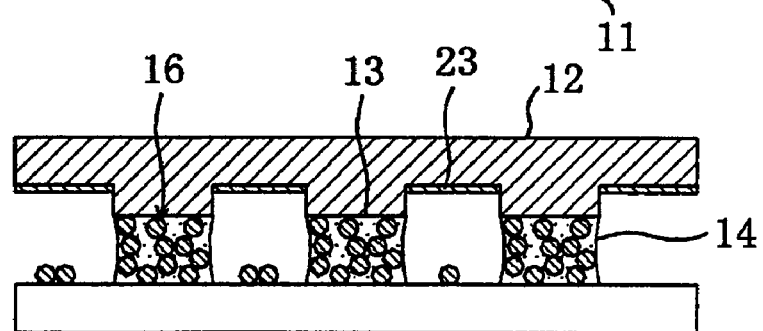

The fluid body (resin) 14 thus forced out self-assembles between the convex patterns 13 formed on the flat plate 12 and the substrate 11 owing to the interfacial force as shown in FIG. 6C.

Figure 6D:
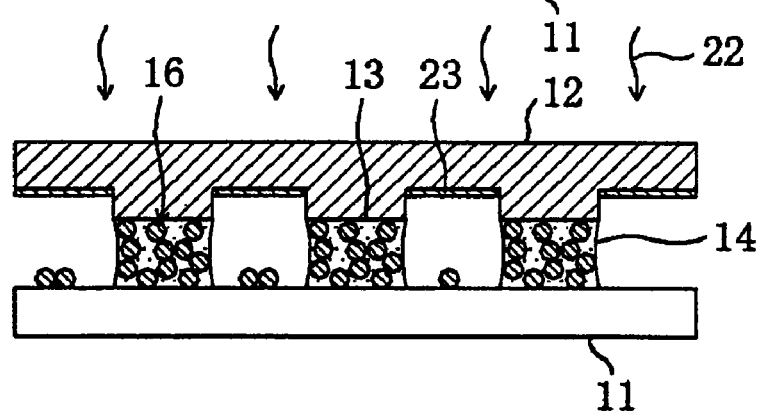

Next, as shown in FIG. 6D, the fluid body (light setting resin) 14 is irradiated with light 22 of UV or the like through the substrate 11. At this point, when the substrate 11 is made of a transparent member (such as glass) and has a light masking film 23 (of, for example, a chromium film) formed on its surface area other than the convex patterns 13, the fluid body (light setting resin) 14 having self-assembled can be selectively irradiated with the light, and as a result, the fluid body (light setting resin) 14 thus irradiated with the light can be selectively cured.

Figure 6E:
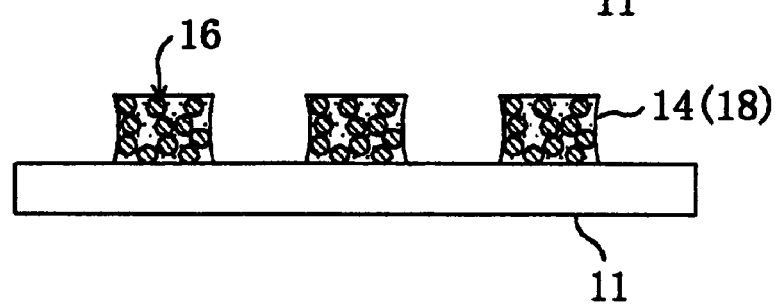

Thereafter, as shown in FIG. 6E, the flat plate 12 is removed, so as to form patterns of the fluid body (light setting resin) 14 obtained through the self-assembly, namely, conductive patterns 18 made of an aggregate of the conductive particles 16, on the substrate 11.

In this manner, when the fluid body (light setting resin) 14 is cured after forming the conductive patterns 18 through the self-assembly, the conductive patterns 18 made of the aggregate of the conductive particles 16 can be formed in a structure stable in the strength.

Although the light setting resin is herein used, a thermosetting resin may be used instead. In the case where a thermosetting resin is used, the contact among the conductive particles 16 can be made stronger through shrinkage of the resin caused during the thermal curing.

Furthermore, when the fluid body (resin) is heated to a temperature at which the conductive particles 16 are melted after the self-assembly of the fluid body (resin) 14, the conductive particles 16 are bonded to one another through metallic bond, and thus, the conductive patterns can be formed in a structure stable in the strength as well as the resistance value of the conducive patterns can be made smaller.

It is noted that when a thermosetting resin is used as the fluid body 14, the conductive particles 16 are melted at the same time as the resin is cured through the aforementioned heat treatment.

Figure 7A:
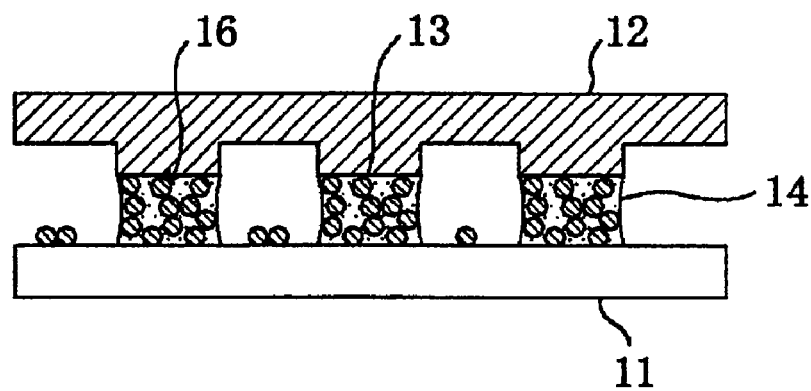
FIGS. 7A through 7C are cross-sectional views for showing procedures in a conductive pattern formation method according to still another embodiment of the invention.
Figure 7B:
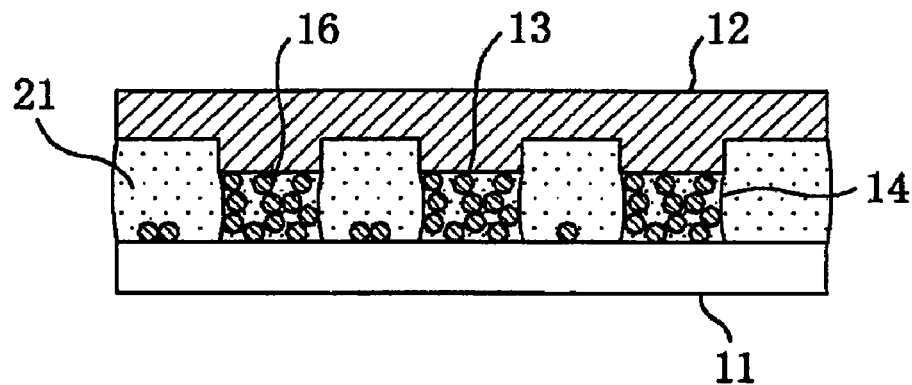
Figure 7C:
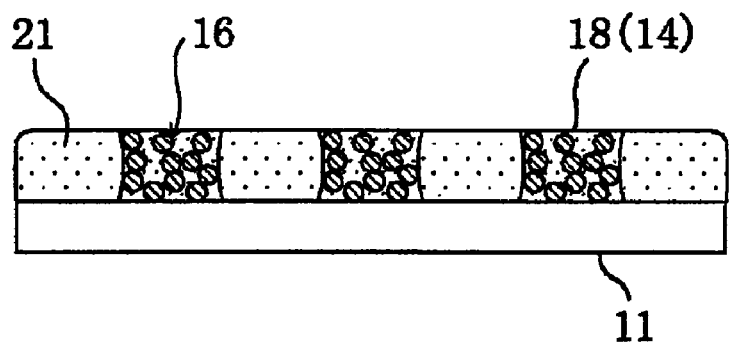

FIGS. 7A through 7C are cross-sectional views for showing exemplified process for allowing the fluid body 14 to self-assemble between the convex patterns 13 and the substrate 11, filling a sealant (of, for example, a resin) in the gap between the substrate and the flat plate 12 and curing the sealant.

FIG. 7A is a diagram for showing a state attained after the procedure of FIG. 4D in the process shown in FIGS. 4A through 4E, namely, a state where the fluid body 14 has self-assembled between the convex patterns 13 and the substrate 11.

Under this condition, a sealant 21 (of, for example, a resin) is filled in the gap between the substrate 11 and the flat plate 12 as shown in FIG. 7B, and the sealant 21 is cured. Thereafter, the flat plate 12 is removed, and projecting portions of the sealant 21 are cut off so as to set the surface of the sealant 21 at the same level as that of the conductive patterns 18 as shown in FIG. 7C.

As shown in FIG. 7C, the conductive patterns 18 (the fluid body 14) formed on the substrate 11 through the self-assembly are sealed with the sealant 21, and thus, the structure of the conductive patterns 18 can be made rigid and the conductive patterns 18 can be protected by the sealant 21.

According to the conductive pattern formation method of this invention, a conductive pattern can be formed in an arbitrary shape, and furthermore, conductive patterns having different heights (thicknesses) can be simultaneously formed. This will be described with reference to FIGS. 8A and 8B.

Figure 8A:
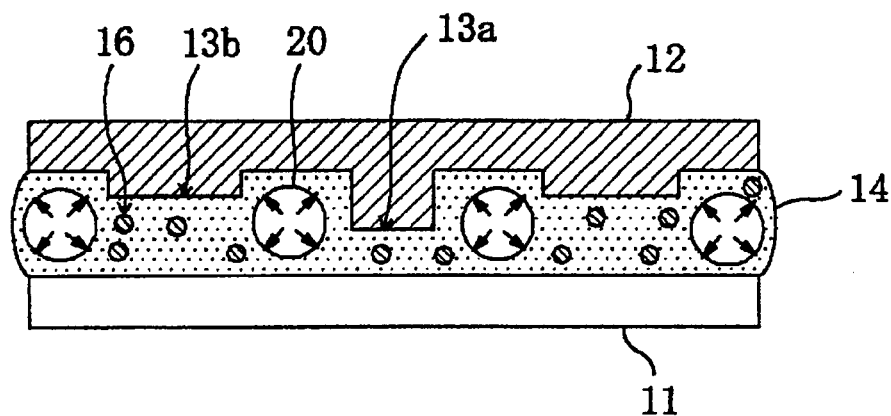
FIGS. 8A through 8C are cross-sectional views for showing procedures in a conductive pattern formation method according to still another embodiment of the invention.

FIG. 8A is a diagram for showing a procedure for supplying a fluid body 14 including conductive particles 16 and a gas bubble generating agent (not shown) into a gap between a substrate 11 and a flat plate 12 and heating the fluid body 14, and this procedure is different from the procedure shown in FIG. 4C in convex patterns 13a and 13b with different heights formed on the flat plate 12.

Figure 8B:
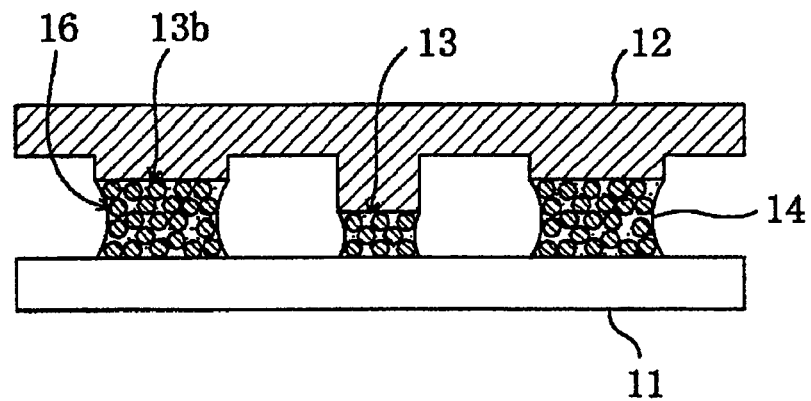

As shown in FIG. 8A, gas bubbles 20 are generated from the gas bubble generating agent included in the fluid body 14, the fluid body 14 is forced out of the gas bubbles 20 as the gas bubbles 20 grow and the fluid body 14 thus forced out self-assembles between the convex patterns 13a and 13b and the substrate 11 owing to the interfacial force as shown in FIG. 8B.

Figure 8C:
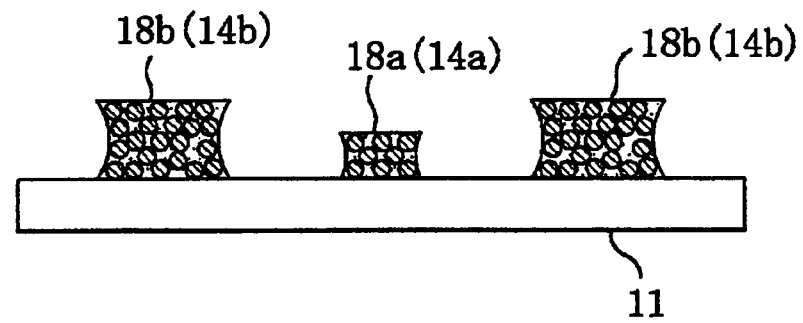

As a result, when the flat plate 12 is removed, conductive patterns 18a and 18b (fluid bodies 14a and 14b) with different heights are formed on the substrate 11 as shown in FIG. 8C.

This is for the following reason: Portions of the fluid body 14 respectively in contact with the surfaces of the convex patterns 13a and 13b are wholly spread over the convex patterns 13a and 13b owing to the interfacial force obtained on the interfaces, and thereafter, the portions of the fluid body 14 can keep their shapes due to the function of the stress caused by the viscosity of the fluid body 14.

On the basis of Formula 1 described above, in order to improve the stability of the column-shaped fluid body (resin column) 14 formed through the self-assembly, among the convex patterns 13a and 13b having the different heights, a pattern with a smaller width (namely, the convex pattern 13a) preferably has a larger height than a pattern with a larger width (namely, the convex pattern 13b).

Since the conductive patterns with the different heights and widths can be thus simultaneously formed, in the case where the conductive patterns are used as, for example, signal lines, impedance can be easily matched.

Moreover, when a release agent such as an acrylic resin is previously applied on a substrate and a conductive pattern is formed on the substrate by the method of this invention so as to transfer the conductive pattern onto another member, the present method is applicable to formation of a microwave circuit conventionally difficult to form. At this point, an adhesive material is preferably applied previously to the member onto which the pattern is transferred.

Furthermore, when conductive patterns partially having different heights are formed on a substrate by the method of this invention and another substrate having a wiring pattern thereon is stacked on the substrate to be pressed at a given pressure, wirings are connected to each other between these substrates through a wiring partially having a larger height. At this point, when the surface of the substrate on which the conductive patterns are formed is placed in a semi-cured state, a multilayered wiring board can be obtained by curing this substrate after connecting the wirings between the substrates.

Herein, the fluid body 14, the conductive particles 16 and the gas bubble generating agent used in the conductive pattern formation method of this invention are not particularly specified, and following materials can be respectively used:

The fluid body 14 may be any fluid body having given viscosity to the extent that it is fluid in a temperature range from room temperature to the melting temperature of the conductive particles 16, and may be a fluid body having viscosity lowered to be fluid by heating. Typical examples are a thermosetting resin such as an epoxy resin, a phenol resin, a silicone resin, a diallyl phthalate resin, a furan resin or a melamine resin, a thermoplastic resin such as polyester estramer, a fluororesin, a polyimide resin, a polyamide resin or an aramid resin, a light (UV) setting resin or the like, and a combination of any of them. Apart from these resins, a high-boiling solvent, an oil or the like can be used.

Furthermore, materials shown in FIGS. 9 and 10 can be appropriately combined to be used as the conductive particles 16 and the gas bubble generating agent. When the melting point of a material of the conductive particles 16 is higher than the boiling point of a material of the gas bubble generating agent, it is possible to perform, after allowing the fluid body to self-assemble by generating gas bubbles from the gas bubble generating agent by heating the fluid body 14, a procedure for further heating the fluid body 14 for melting the conductive particles included in the fluid body having self-assembled so as to bond the conductive particles to one another through the metallic bond.

Moreover, the gas bubble generating agent may be made of two or more kinds of materials having different boiling points. When the boiling points are different, there arises a difference in timing of the generation and the growth of the gas bubbles, and as a result, the fluid body 14 is forced out through the growth of the gas bubbles in a stepwise manner. Therefore, the process of the self-assembly of the fluid body 14 can be made homogeneous, so that conductive patterns with more homogeneity can be formed.

Apart from the materials shown in FIG. 10, a material for generating gas bubbles through thermal decomposition of the gas bubble generating agent in heating the fluid body 14 can be used as the gas bubble generating agent. As such a gas bubble generating agent, any of materials shown in FIG. 11 can be used. For example, in the case where a compound including water of crystallization (aluminum hydroxide) is used, it is thermally decomposed when the fluid body 14 is heated, so as to generate steam in the form of gas bubbles.

Although the present invention has been described in preferred embodiments, it goes without saying that the description is not restrictive but the disclosed invention may be modified in numerous ways. For example, after allowing the fluid body to self-assemble between the convex patterns and the substrate, the flat plate may be pressed against the substrate for contact bonding the conductive particles.

Alternatively, the procedure for allowing the fluid body to self-assemble between the convex patterns and the substrate may be performed while changing the gap between the substrate and the flat plate. Thus, the fluid body can be made to efficiently self-assemble between the convex patterns and the substrate.

Moreover, at least surface portions of the convex patterns may be made of a metal. Thus, the fluid body can be made more easily self-assemble because the interfacial force is varied on the metal surface. Furthermore, in the case where the conductive patterns are formed through the metallic bond of the conductive particles by melting the conductive particles, the melted conductive particles can be easily bonded to the metal face with high wettability, so as to further reduce the resistance value.

INDUSTRIAL APPLICABILITY

According to the present invention, a conductive pattern formation method in which a fine pattern can be formed in a simple way at low cost is provided.

The invention claimed is:

1. A method for forming a conductive pattern on a substrate comprising:
    a first step of providing a flat plate having a convex pattern on a surface thereof in facing relation to the substrate;
    a second step of supplying a fluid body containing conductive particles and a gas bubble generating agent into a gap between the substrate and the flat plate; and
    a third step of generating gas bubbles from the gas bubble generating agent contained in the fluid body by heating the fluid body,
    in the third step, the fluid body being forced out of the gas bubbles generated from the gas bubble generating agent as the gas bubbles grow and self-assembling between the convex pattern formed on the flat plate and the substrate owing to interfacial force, and the conductive pattern formed on the substrate being made of an aggregate of the conductive particles contained in the fluid body having self-assembled.

2. The method for forming a conductive pattern on a substrate of claim 1,
    wherein the fluid body is made of a resin, and
    the third step includes a sub-step of curing the resin after allowing the resin to self-assemble between the convex pattern and the substrate.

3. The method for forming a conductive pattern on a substrate of claim 2,
    wherein the resin is made of a light setting resin, and
    the resin having self-assembled between the convex pattern and the substrate is cured with light by selectively irradiating the resin with light in the third step.

4. The method for forming a conductive pattern on a substrate of claim 3,
    wherein the flat plate is made of a transparent substrate, and
    a light masking film is formed in a surface area of the flat plate other than the convex pattern.

5. The method for forming a conductive pattern on a substrate of claim 1,
    wherein the conductive pattern is made of the aggregate of the conductive particles in which the conductive particles are in contact with one another.

6. The method for forming a conductive pattern on a substrate of claim 1,
    wherein the third step includes a sub-step of heating the fluid body at a temperature at which the conductive particles are melted after allowing the fluid body to self-assemble between the convex pattern and the substrate, and
    the conductive particles are bonded to one another through metallic bond in the sub-step of heating.

7. The method for forming a conductive pattern on a substrate of claim 6,
    wherein a melting point of the conductive particles is higher than a boiling point of the gas bubble generating agent.

8. The method for forming a conductive pattern on a substrate of claim 1,
    wherein the third step includes a sub-step of pressing the flat plate against the substrate after allowing the fluid body to self-assemble between the convex pattern and the substrate, and
    the conductive particles are contact bonded to one another in the sub-step of pressing.

9. The method for forming a conductive pattern on a substrate of claim 1,
    wherein the gas bubble generating agent is made of a material that boils when the fluid body is heated or a material that produces a gas through thermal decomposition.

10. The method for forming a conductive pattern on a substrate of claim 1,
    wherein the gas bubble generating agent is made of two or more kinds of materials having different boiling points.

11. The method for forming a conductive pattern on a substrate of claim 1,
    wherein the third step is performed while varying the gap between the substrate and the flat plate.

12. The method for forming a conductive pattern on a substrate of claim 1,
    wherein at least a surface of the convex pattern is made of a metal.

13. The method for forming a conductive pattern on a substrate of claim 1,
    wherein the third step includes a sub-step of filling a sealant in the gap between the substrate and the flat plate after allowing the fluid body to self-assemble between the convex pattern and the substrate and curing the sealant after filling.

14. The method for forming a conductive pattern on a substrate of claim 1,
    wherein the convex pattern is formed as a convex pattern having at least two kinds of portions with different heights.

15. The method for forming a conductive pattern on a substrate of claim 14,
    wherein a portion with a smaller width is higher than a portion with a larger width in the convex pattern.

16. The method for forming a conductive pattern on a substrate of claim 1,
    wherein the substrate is a wiring board, and
    the conductive pattern corresponds to at least a part of a wiring pattern formed on the wiring board.

17. The method for forming a conductive pattern on a substrate of claim 1, further comprising a step of removing the flat plate after the third step.

18. The method for forming a conductive pattern on a substrate of claim 1,
    wherein the conductive pattern has a cross-section in a shape of an hourglass.

* * * * *